United States Patent
Ozawa (10) Patent No.: US 8,675,282 B2
(45) Date of Patent: *Mar. 18, 2014

(54) SOLID-STATE IMAGING DEVICE AND METHOD FOR MANUFACTURING THE SAME

(75) Inventor: Ken Ozawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 31 days.

This patent is subject to a terminal disclaimer.

(21) Appl. No.: 12/408,459

(22) Filed: Mar. 20, 2009

(65) Prior Publication Data

US 2009/0174020 A1     Jul. 9, 2009

Related U.S. Application Data

(63) Continuation of application No. 11/284,050, filed on Nov. 21, 2005, now Pat. No. 7,525,733.

(30) Foreign Application Priority Data

Nov. 26, 2004 (JP) ................................. 2004-341602

(51) Int. Cl.
   *G02B 27/10*     (2006.01)
(52) U.S. Cl.
   USPC ........................................................ 359/626
(58) Field of Classification Search
   USPC ............................ 359/619, 626, 629; 438/57
   See application file for complete search history.

(56) References Cited

U.S. PATENT DOCUMENTS

| | | | |
|---|---|---|---|
| 5,336,367 A | 8/1994 | Nomura | |
| 5,482,800 A | 1/1996 | Gal | |
| 5,725,975 A | 3/1998 | Nakamura et al. | |
| 6,355,399 B1 | 3/2002 | Sajan et al. | |
| 6,402,905 B1 * | 6/2002 | Baldwin et al. | 204/192.13 |
| 6,524,756 B1 * | 2/2003 | Wu | 430/5 |
| 6,621,533 B2 * | 9/2003 | Slack et al. | 349/5 |
| 6,638,786 B2 | 10/2003 | Yamamoto | |
| 7,033,736 B2 * | 4/2006 | Morris et al. | 430/321 |
| 7,049,168 B2 | 5/2006 | Findlater et al. | |
| 7,068,432 B2 * | 6/2006 | Boettiger et al. | 359/619 |
| 7,253,394 B2 | 8/2007 | Kang | |
| 2002/0025164 A1 | 2/2002 | Suzuki | |
| 2006/0006438 A1 | 1/2006 | Maruyama | |
| 2006/0066922 A1 | 3/2006 | Nishi | |
| 2006/0170810 A1 | 8/2006 | Kim | |
| 2007/0063300 A1 | 3/2007 | Hwang | |

FOREIGN PATENT DOCUMENTS

| | | |
|---|---|---|
| JP | 01-213079 | 8/1989 |
| JP | 06-140609 | 5/1994 |
| JP | 2004-144841 | 5/2004 |
| JP | 2006-049721 | 2/2006 |

* cited by examiner

*Primary Examiner* — Scott J Sugarman
*Assistant Examiner* — Vipin Patel
(74) *Attorney, Agent, or Firm* — Rader, Fishman & Grauer PLLC (57) ABSTRACT

A solid state imaging device includes a substrate having a plurality of pixels and a plurality of on-chip lenses arranged above the substrate, each on-chip lens having a lens surface formed by subjecting a transparent photosensitive film to exposure using a mask having a gradation pattern and development so that the lens surface serves to correct shading in accordance with the gradation pattern.

23 Claims, 11 Drawing Sheets

| PATTERN NO. | Y IMAGE HEIGHT (um) | SAG (um) | LENS HEIGHT (um) | EXPOSURE (mJ/cm²) | TRANSMITTANCE | SPACE SIZE (nm) |
|---|---|---|---|---|---|---|
| -6 | -2.500 | 0.851 | 1.149 | 38.1 | 0.149 | 160.8 |
| -5 | -2.083 | 0.619 | 1.381 | 24.8 | 0.097 | 129.7 |
| -4 | -1.667 | 0.459 | 1.541 | 18.9 | 0.074 | 113.1 |
| -3 | -1.250 | 0.357 | 1.643 | 16.0 | 0.063 | 104.3 |
| -2 | -0.833 | 0.305 | 1.695 | 14.8 | 0.058 | 100.4 |
| -1 | -0.417 | 0.300 | 1.700 | 14.7 | 0.058 | 100.0 |
| 0 | 0.000 | 0.339 | 1.661 | 15.6 | 0.061 | 103.0 |
| 1 | 0.417 | 0.422 | 1.578 | 17.8 | 0.069 | 109.8 |
| 2 | 0.833 | 0.549 | 1.451 | 21.9 | 0.086 | 122.0 |
| 3 | 1.250 | 0.723 | 1.277 | 29.9 | 0.117 | 142.5 |
| 4 | 1.667 | 0.947 | 1.053 | 46.0 | 0.180 | 176.7 |
| 5 | 2.083 | 1.230 | 0.770 | 81.9 | 0.320 | 235.7 |
| 6 | 2.500 | 1.583 | 0.417 | 173.5 | 0.678 | 343.1 |

SOLID-STATE IMAGING DEVICE AND METHOD FOR MANUFACTURING THE SAME

The subject matter of application Ser. No. 11/284,050, is incorporated herein by reference. The present application is a Continuation of U.S. Ser. No. 11/284,050, filed Nov. 21, 2005, which claims priority to Japanese Patent Application JP 2004-341602 filed in the Japanese Patent Office on Nov 26, 2004, the entire contents of which are incorporated herein by reference.

BACKGROUND OF THE INVENTION

1. Field of the Invention

The present invention relates to a solid-state imaging device, such as a charge-coupled device (CCD) image sensor and a complementary metal-oxide semiconductor (CMOS) image sensor, having shading-corrected on-chip lenses on a substrate provided with a plurality of pixels and a method for manufacturing the solid-state imaging device.

2. Description of the Related Art

In video cameras or the like including solid-state imaging devices (refer to, for example, Japanese Unexamined Patent Application Publication No. 6-140609), objective lenses placed in the camera bodies are generally of the inner focus type so that the autofocus speed can be increased. Accordingly, the eye-point distance has recently been considerably reduced from about 100 mm to around 30 mm, and is expected to be further reduced to less than about 15 mm.

Figure 9:
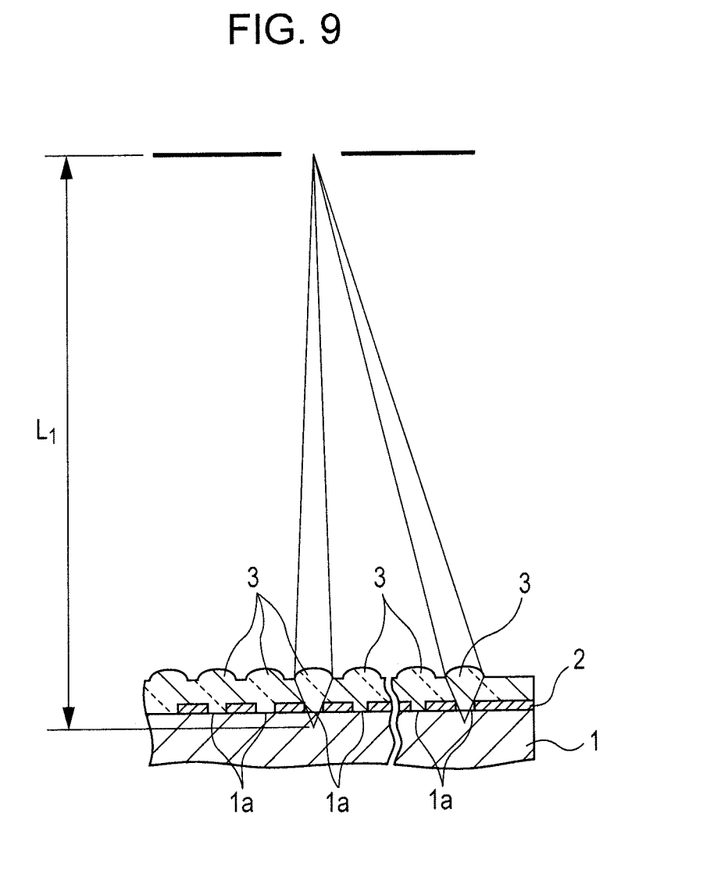
FIG. 9 is a sectional view of a known solid-state imaging device included in a system having a long eye-point distance L1.
Figure 10:
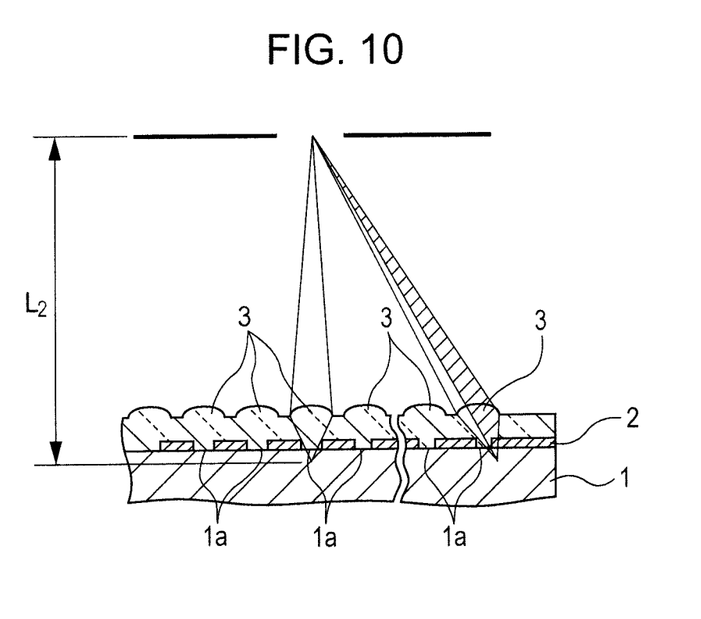
FIG. 10 is a sectional view of a known solid-state imaging device included in a system having a short eye-point distance L2.

FIGS. 9 and 10 are sectional views illustrating known solid-state imaging devices used in systems with different eye-point distances. In the figures, identical components are denoted by the same reference numerals.

As shown in the figures, each of the solid-state imaging devices includes a semiconductor substrate 1, a plurality of light-receiving sections 1a that form a pixel array on the semiconductor substrate 1, and a shading film 2 provided on the pixel array. The shading film 2 is patterned such that each of the light-receiving sections 1a is exposed through an opening formed therein. In addition, an on-chip lens 3 is formed integrally on each of the light-receiving sections 1a.

Referring to FIG. 9, when the solid-state imaging device having the above-described structure is used in a system having a long eye-point distance, incident light collected by the on-chip lenses 3 reaches the exposed surfaces of the corresponding light-receiving sections 1a even in a peripheral region distant from the center of the pixel array.

However, if the eye-point distance of the system including the known solid state imaging device is reduced, the percentage of light that reaches the light-receiving sections 1a is reduced in the peripheral region of the pixel array, which leads to sensitivity shading. More specifically, as shown in FIG. 10, the on-chip lens 3 positioned directly above the light-receiving section 1a at the periphery of the pixel array can collect only a part of light obliquely incident on the light-receiving section 1a. Therefore, a part of the incident light shown by the hatched area in FIG. 10 is incident on the shading film 2 instead of being received by the light-receiving section 1a. This is called shading, and the degree of shading increases as the eye-point distance is reduced.

Accordingly, methods for correcting shading of the on-chip lenses have been suggested (refer to, for example, Japanese Unexamined Patent Application Publication No. 1-213079).

For example, an on-chip lens array, such as a planar on-chip lens array, is reduced around the effective pixel center by multiplying a reduction scaling factor (for example, 0.999), so that the horizontal displacement between the light-receiving section of each pixel and the corresponding on-chip lens is varied toward the periphery such that amount by which the light-collecting section is shifted from the light-receiving section toward the center is gradually increased.

Figure 11:
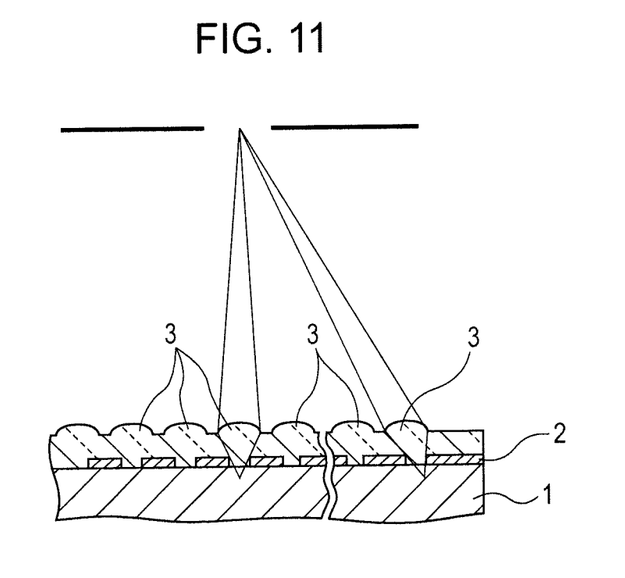
FIG. 11 is a sectional view illustrating the case in which shading correction is applied to the solid state imaging device shown in FIG. 10.

Due to the above-described shading correction, as shown in FIG. 11, the center of a light-receiving section of the pixel at the periphery of the pixel array is aligned with the center of the corresponding on-chip lens 3 along an optical axis. Thus, the centering error caused by the exit pupil is corrected.

The above-described on-chip lenses are formed by the following method.

Figure 12A:
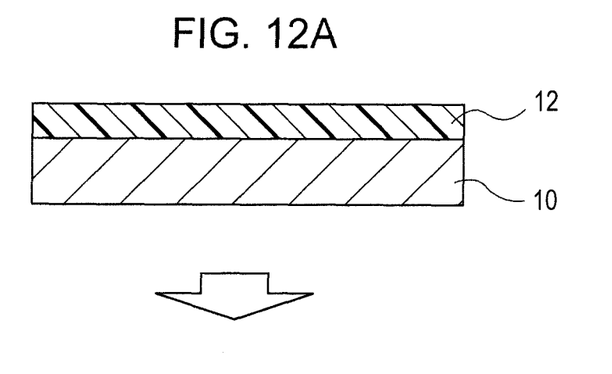
FIG. 12A is a sectional view illustrating a step of a known on-chip lens forming process.
Figure 12B:
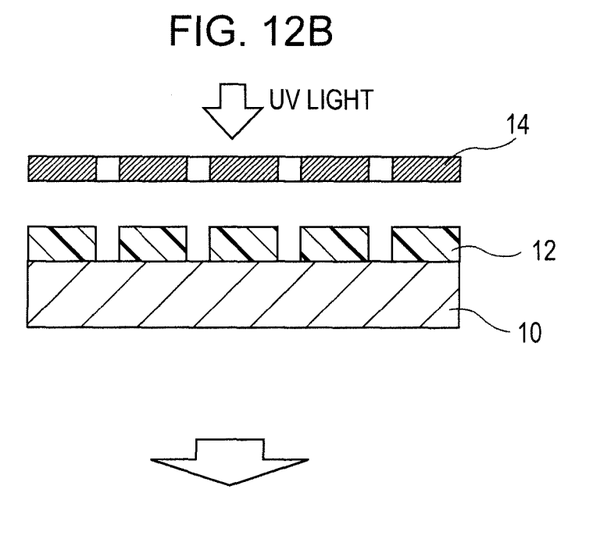
FIG. 12B is a sectional view illustrating another step of the known on-chip lens forming process.
Figure 12C:
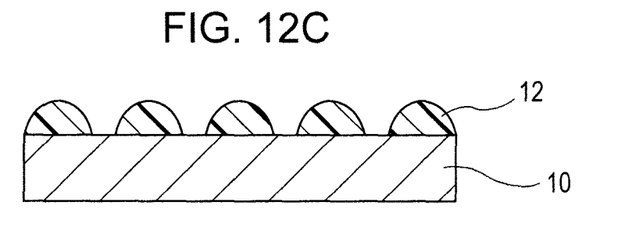
FIG. 12C is a sectional view illustrating another step of the known on-chip lens forming process.

That is, first, as shown in FIG. 12A, photoresist 12 including light transmitting material, such as ultraviolet sensitive resin, is arranged on a base substrate 10. Then, as shown in FIG. 12B, ultraviolet light is radiated through a mask 14, so that the photoresist 12 is formed into a matrix pattern corresponding to the pixel array. In this step, transferring is performed with a magnification obtained by multiplying the projection magnification of the exposure apparatus by the above-described scaling factor. Then, as shown in FIG. 12C, a heating process is performed so that the photoresist 12 is formed into hemispherical elements due to the surface tension thereof. This is called a thermal reflow process, and is used in common.

SUMMARY OF THE INVENTION

However, the above-described thermal reflow process is basically a thermal control process, and it is difficult to achieve good repeatability in mass production.

In addition, in the patterning step for forming the on-chip lenses according to, for example, Japanese Unexamined Patent Application Publication No. 1-213079, the magnification is multiplied by the scaling factor. Accordingly, a plurality of projection magnifications are used in the exposure step. Therefore, the process is complex and it is difficult to ensure the stability of the projection exposure apparatus.

Accordingly, it is desirable to provide a solid-state imaging device having shading-corrected on-chip lenses that can be easily formed with high stability and improved repeatability compared to those formed by a thermal reflow process and a method for manufacturing the solid-state imaging device.

An embodiment of the present invention provides a solid-state imaging device including a substrate having a plurality of pixels and a plurality of on-chip lenses arranged above the substrate, each on-chip lens having a lens surface formed by subjecting a transparent photosensitive film to exposure using a mask having a gradation pattern and development so that the lens surface serves to correct shading in accordance with the gradation pattern.

In addition, another embodiment of the present invention provides a method for manufacturing a solid state imaging device including a substrate provided with a plurality of pixels and a plurality of on-chip lenses arranged above the substrate. The method includes the steps of exposing a transparent photosensitive film to light through a mask having a gradation pattern; and developing the transparent photosensitive film after exposure, thereby forming a lens surface that serves to correct shading in accordance with the gradation pattern.

In the solid-state imaging device and the method for manufacturing the solid state imaging device according to the embodiment of the present invention, each of the on-chip lenses has a lens surface formed by subjecting a transparent photosensitive film to exposure using a mask having a gradation pattern and development so that the lens surface serves to correct shading in accordance with the gradation pattern. Accordingly, a desired lens surface can be obtained in accordance with the gradation pattern of the mask. Therefore, compared to the known method using the scaling factor and the thermal reflow process, obliquely incident light can be reliably corrected by the lens surface optimized for each pixel. As a result, the light-receiving performance can be improved. In addition, since the thermal reflow process is not performed, the repeatability of the lens surface can be improved with a simple manufacturing process and a high-definition solid-state imaging device can be obtained.

In addition, when the lens surface is defined by a surface function that varies in accordance with an image height, the lens surface can be optimized in accordance with the image height of each pixel. Accordingly, the obliquely incident light can be more reliably controlled.

When the surface function defines a surface obtained by superimposing an inclination component on a spherical surface or a surface asymmetric about the center of the corresponding pixel, there is a large freedom in designing the lens shape. In addition, when the surface function defines a surface that causes a principal ray to perpendicularly enter an imaging element at the center thereof, the light-collecting efficiency an be effectively increased at each of the light-receiving sections.

In addition, when a so-called gray-tone mask, in particular a gray-tone mask having a simple binary pattern, is used as the mask having the gradation pattern, the solid-state imaging device can be manufactured using a simple apparatus. In addition, when full-plate exposure for all of the pixels is performed in the step of exposing the transparent photosensitive film, the solid state imaging device can be manufactured by a simple exposure process.

DESCRIPTION OF THE PREFERRED EMBODIMENT

According to an embodiment of the present invention, photoresist, such as ultraviolet sensitive resin, is exposed to ultraviolet light using a so-called gray-tone mask, so that the resist can be directly formed into elements having lens surfaces after exposure and development. This is based on the principle described in Japanese Patent Application No. 2003-18439, which has been applied by the inventors of the present invention. According to this principle, the light intensity distribution on the exposure surface is arbitrarily controlled using an exposure mask, thereby controlling the height distribution of the developed resist.

The above-described known on-chip lenses formed by the thermal reflow process are naturally limited to spherical lenses having a four-quadrant symmetry. In comparison, according to the present embodiment, each lens can be formed to have a free-form surface and the shapes of the lenses can be changed individually.

In order to correct the above-described shading, the surface function of the on-chip lenses is changed toward the periphery of the pixel array. More specifically, an inclination component superimposed on a normal lens surface function is increased toward the periphery of the pixel array so that even when light is incident on the pixel array at a large angle in a peripheral region thereof, the principal ray of the incident light perpendicularly enters each light-receiving section at the center thereof. Accordingly, shading can be reliably corrected in accordance with the image height (distance from the center of the pixel array) of each pixel.

According to the present embodiment, since the on-chip lenses are formed without performing the thermal reflow process, the repeatability of the manufacturing process is increased. The shape of the on-chip lenses is gradually changed toward the periphery of the pixel array, and shading is corrected by controlling the lens surface function of each lens instead of shifting the lens position using the scaling factor. Accordingly, the magnification of the exposure apparatus is not multiplied by the scaling factor, so that the process can be made simpler and the stability of the exposure apparatus can be increased.

In addition, in all of the pixels from the center of the pixel array to the periphery, the principal ray perpendicularly enters the light-receiving sections. Therefore, unlike the known structure in which the on-chip lenses are shifted using the scaling factor, the incident angle characteristic is uniform over the entire region of the pixel array, which provides ideal shading correction.

Figure 1A:
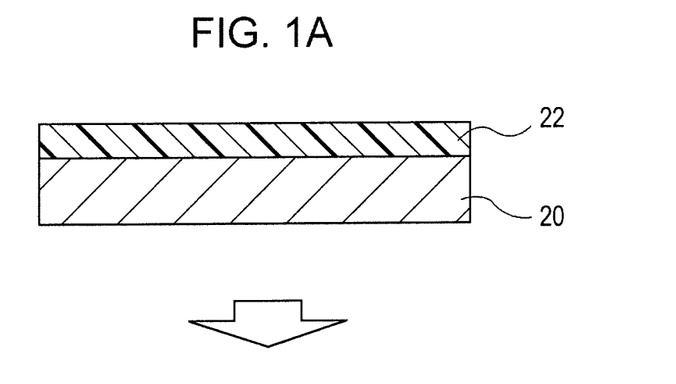
FIG. 1A is a sectional views illustrating a step of a method for forming on-chip lenses in a solid state imaging device according to an embodiment of the present invention.
Figure 1B:
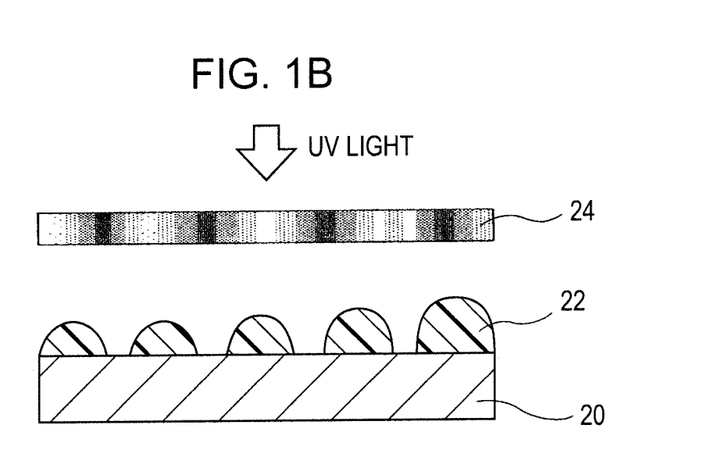
FIG. 1B is another sectional view illustrating another step of the method for forming on-chip lenses in a solid state imaging device according to an embodiment of the present invention.
Figure 2A:
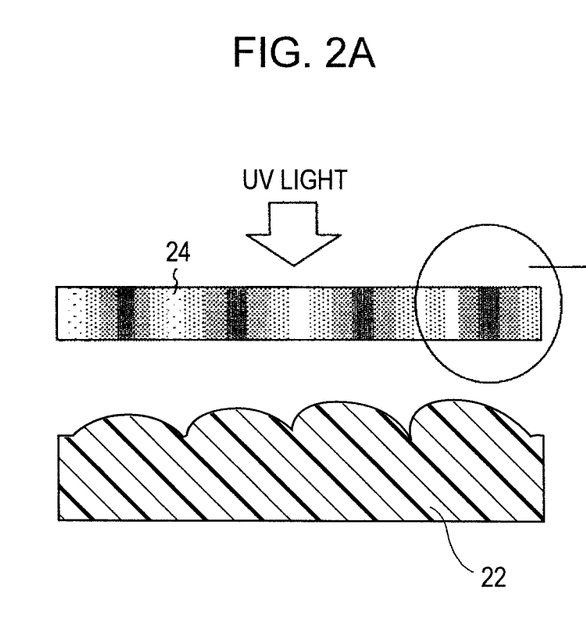
FIG. 2A is a diagram illustrating the shapes of the on-chip lenses formed by the method shown in FIGS. 1A and 1B.
Figure 2B:
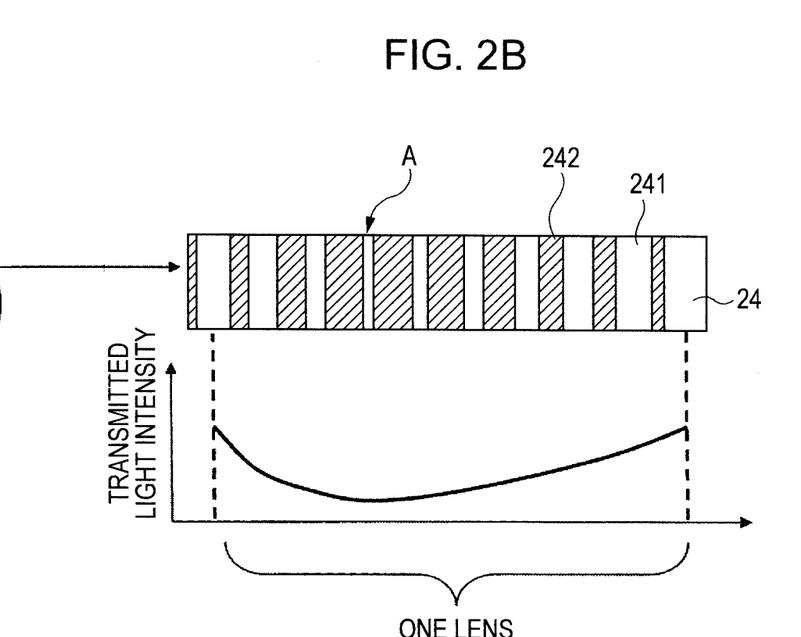
FIG. 2B is a schematic diagram illustrating a gray mask.

FIGS. 1A and 1B show sectional views illustrating a method for forming on-chip lenses included in a solid state imaging device according to an embodiment of the present invention. FIGS. 2A and 2B are diagrams illustrating the shapes of the on-chip lenses formed by the method shown in FIGS. 1A and 1B. FIG. 2A shows a schematic diagram illustrating an exposure process using a gray-tone mask, and FIG. 2B shows a binary gray-tone mask and the intensity distribution of light that is transmitted therethrough.

In the present embodiment, in order to simplify the explanation, a one-dimensional on-chip lens array and a one-dimensional pixel array will be described.

As shown in FIG. 1A, according to the present embodiment, photoresist 22 that serves as, for example, a photocurable, transparent photosensitive film is disposed on a base substrate 20. Then, as shown in FIG. 1B, full-plate exposure of ultraviolet light is performed using a gray-tone mask 24. Then, development is performed so that the resist 22 is directly formed into elements having lens surfaces. Accordingly, on-chip lenses are formed without performing the thermal reflow process.

The gray-tone mask used in the present embodiment has a fine binary pattern including light transparent sections and nontransparent sections in each lens. The transmitted light intensity is varied depending on the ratio of the area of the transparent sections to the area of the nontransparent sections (that is, the ratio of the area of space pattern elements to the area of line pattern elements). As shown in FIG. 2B, the transmitted light intensity is reduced in an area where nontransparent sections 242 are relatively thick, and is increased in an area where transparent sections 241 are relatively thick. Thus, the light intensity distribution can be varied in each lens by continuously varying the ratio of the area of the nontransparent sections 242 to the area of the transparent sections 241, and a desired exposure amount distribution can be set in the exposure step. Accordingly, elements having desired surface shapes can be obtained after developing the resist.

Next, the lens shape used in the present embodiment will be described in detail below.

Figure 3A:
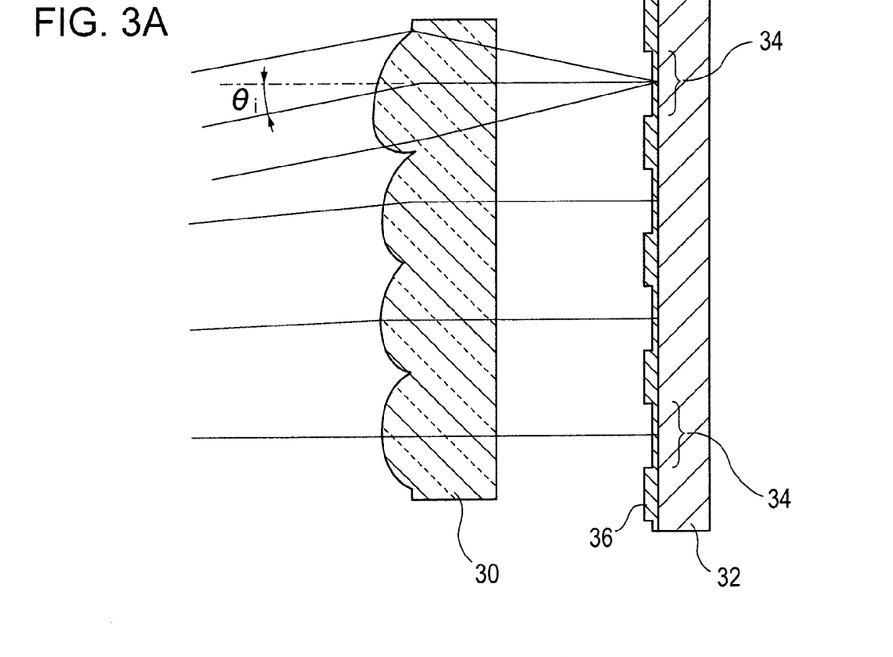
FIG. 3A is a schematic diagram illustrating the shapes of the on-chip lenses that correct the incidence of light on imaging elements.

First, a system shown in FIG. 3A in which light is incident on the on-chip lenses in the peripheral region of the pixel array is considered. Referring to the figure, a plurality of light-receiving sections 34 forming a pixel array are provided on a semiconductor substrate 32, and a shading film 36 is disposed on the light-receiving sections 34. In addition, on-chip lenses 30 are placed at positions separated from the light-receiving sections 34 by a predetermined distance.

Figure 3B:
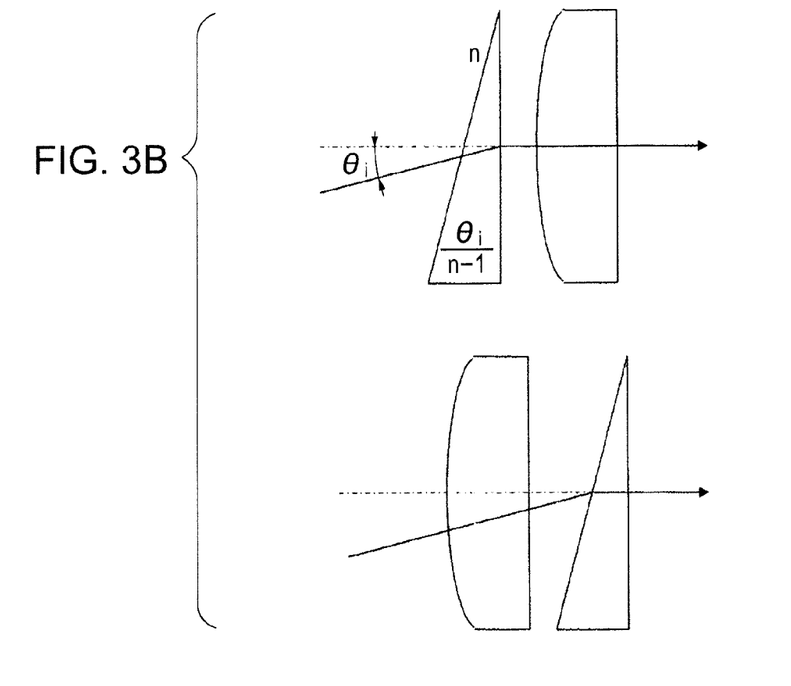
FIG. 3B is a diagram illustrating the design of each of the on-chip lenses shown in FIG. 3A.

In the following discussion, it is assumed that the on-chip lens 30 corresponding to a light-receiving section 34 at an arbitrary image height i receives light with an F-number of 2.8 at an incident angle $\theta_i$. In addition, it is also assumed that the on-chip lenses 30 are made of photosensitive resin with a refractive index n. As is understood from FIG. 3B, when $\theta$ is small, the principal ray of the incident light can be caused to perpendicularly enter the corresponding light-receiving section using an on-chip lens combined with a prism having a deviation angle of $\theta_i/(n-1)$. Accordingly, the on-chip lenses 30 are shaped as shown in FIG. 3A.

Figure 4:
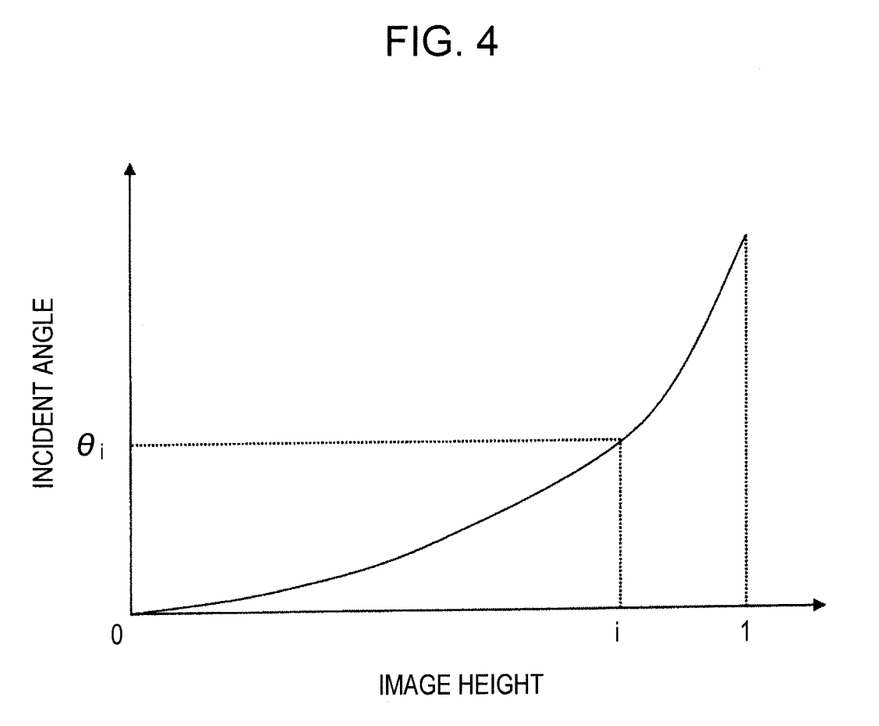
FIG. 4 is a diagram illustrating the angular characteristic of light incident on a pixel array.

Next, it is assumed that light that enters the imaging device, such as a video camera, has an incident angle characteristic represented by the characteristic curve shown in FIG. 4. The incident angle characteristic is uniquely determined by the design of the lens system positioned in front of the imaging elements. In FIG. 4, the vertical axis shows the incident angle of the principal ray and the horizontal axis shows the image height. As the image height increases, the incident angle generally increases along the characteristic curve. When the field angle can be varied with a zoom lens or the like, the incident angle characteristic varies depending on the zoom position. In such a case, the incident angle characteristic at an average middle position is used as a representative incident angle characteristic. Accordingly, the incident angle $\theta_i$ can be determined for each of the light-receiving sections 34 in accordance with the image height i.

The prism deviation angle for the light-receiving section 34 at the image height i is calculated as $\theta_i/(n-1)$, and the inclination component of the surface function of the corresponding on-chip lens is thus determined.

For simplicity, it is assumed that the on-chip lens disposed at a position corresponding to the center of the pixel array is a 5 μm square spherical lens with a radius of curvature r, a central thickness d, and a back focus of 5 μm. Accordingly, the on-chip lens corresponding to the light-receiving section at the center of the pixel array (i=0) has a surface shown in FIG. 5B. FIG. 5B shows light rays incident at 0° and 5°. It is clear from FIG. 5B that light incident at 5° is displaced from the light-receiving section.

The surface function of the on-chip lens that causes light with the incident angle $\theta_i$ to perpendicularly enter the corresponding light-receiving section can be expressed as follows:

$$Z(y) = \frac{cy^2}{1+\sqrt{1-(1+k)c^2y^2}} + y\tan\left(\frac{\theta_i}{n-1}\right) \quad (1)$$

where Z is the amount of sag, which is the depth from each lens center (y=0) in the Z direction, k is the conic constant, y is the distance from the lens center, and c is the curvature, i.e., the reciprocal of the radius of curvature (r).

Figure 5A:
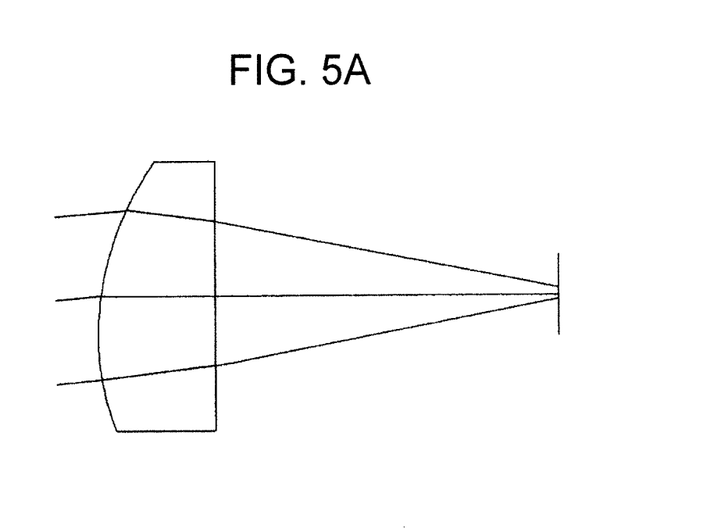
FIG. 5A is a diagram illustrating an example of lens design according to the embodiment shown in FIGS. 1A and 1B.
Figure 5B:
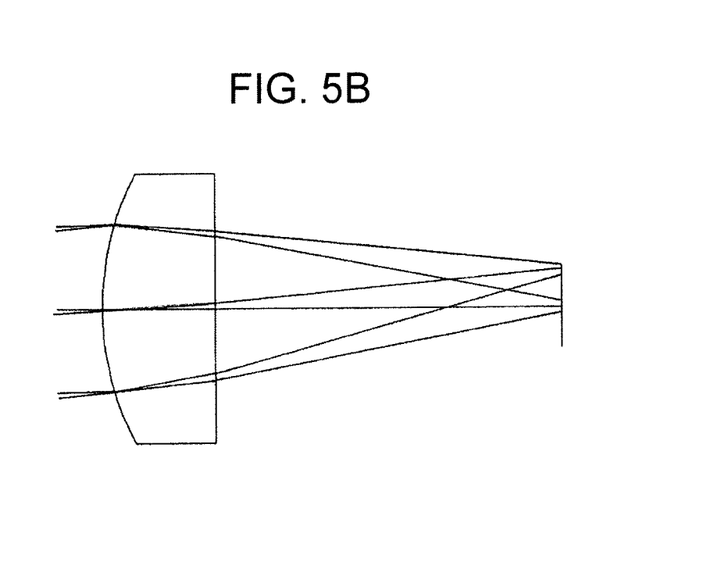
FIG. 5B is a diagram illustrating another example of lens design according to the embodiment shown in FIGS. 1A and 1B.

FIG. 5A shows the result of ray tracing under the conditions k=0, n=1.5, $\theta_i$=5°, d=1.66 μm, and c=¼ (1 μm). It is clear from the figure that even though light is incident at an angle, the principal ray perpendicularly enters the light-receiving section at the center thereof. Accordingly, the incident angle of the principal ray that travels toward the light-receiving section at each image height i is determined from the characteristic curve shown in FIG. 4, and the surface function of the on-chip lens for causing the principal ray to perpendicularly enter the light-receiving section at the center thereof is determined from Equation (1).

In the present embodiment, the on-chip lenses are designed by the above-described procedure, so that the surface function thereof gradually varies depending on the image height, as shown in FIG. 2A. Accordingly, the principal ray incident on each on-chip lens perpendicularly enters the corresponding light-receiving section at the center thereof. Therefore, shading is reliably corrected over the entire region of the imaging element.

Next, a mask for forming the on-chip lenses will be described below. In the present embodiment, the lens array shown in FIG. 2A is formed by full plate exposure by a semiconductor process shown in FIGS. 1A and 1B.

For simplicity of description, a case in which a one-dimensional lens array that is designed as described above is formed so as to correct shading will be explained below. In addition, it is assumed that a positive resist is used.

The conditions of the exposure apparatus include: the exposure wavelength 365 nm, NA=0.5, σ=0.5, and the minimum projection magnification ⅕. Here, σ is a coherence factor that is expressed as σ=(illumination NA)/(projection lens NA). In addition, the initial resist thickness is set to 2 μm, and the characteristic of thickness that remains after development versus the amount of exposure is expressed as Z=A+ B·ln(dose), where "dose" is the amount of exposure with the unit of [mJ/cm$^2$]. In this example, the characteristic shown in FIG. 6, where A=2.7 and B=−0.45, is used.

Next, to avoid image formation, a maximum pattern pitch of the gray mask is determined as follows:

$$P\min = \frac{\lambda}{NA(1+\sigma)} \quad (2)$$

Accordingly, when the above-mentioned optical conditions are used, the mask pattern does not form an image as long as the pitch is 487 nm or less. In addition, since the size of each on-chip lens is 5 μm square and is relatively small, it is desirable to precisely control the shape thereof by using as many pattern elements as possible. In addition, since the pattern pitch is set to a value obtained by multiplying the size of each lens by (1/integer), the pattern pitch (P) is set to, for example, of 5000 nm/12=416.7 nm. In this case, each lens is formed by thirteen space pattern elements.

The desired amount of sag Z(y) for each y coordinate is calculated by Equation (1), and the distribution of the amount of exposure for obtaining the desired amount of sag Z(y) after development is calculated from the above-mentioned characteristic of residual thickness as follows:

$$dose(y) = \exp\left(\frac{Z(y)-A}{B}\right) \quad (3)$$

Figure 7:
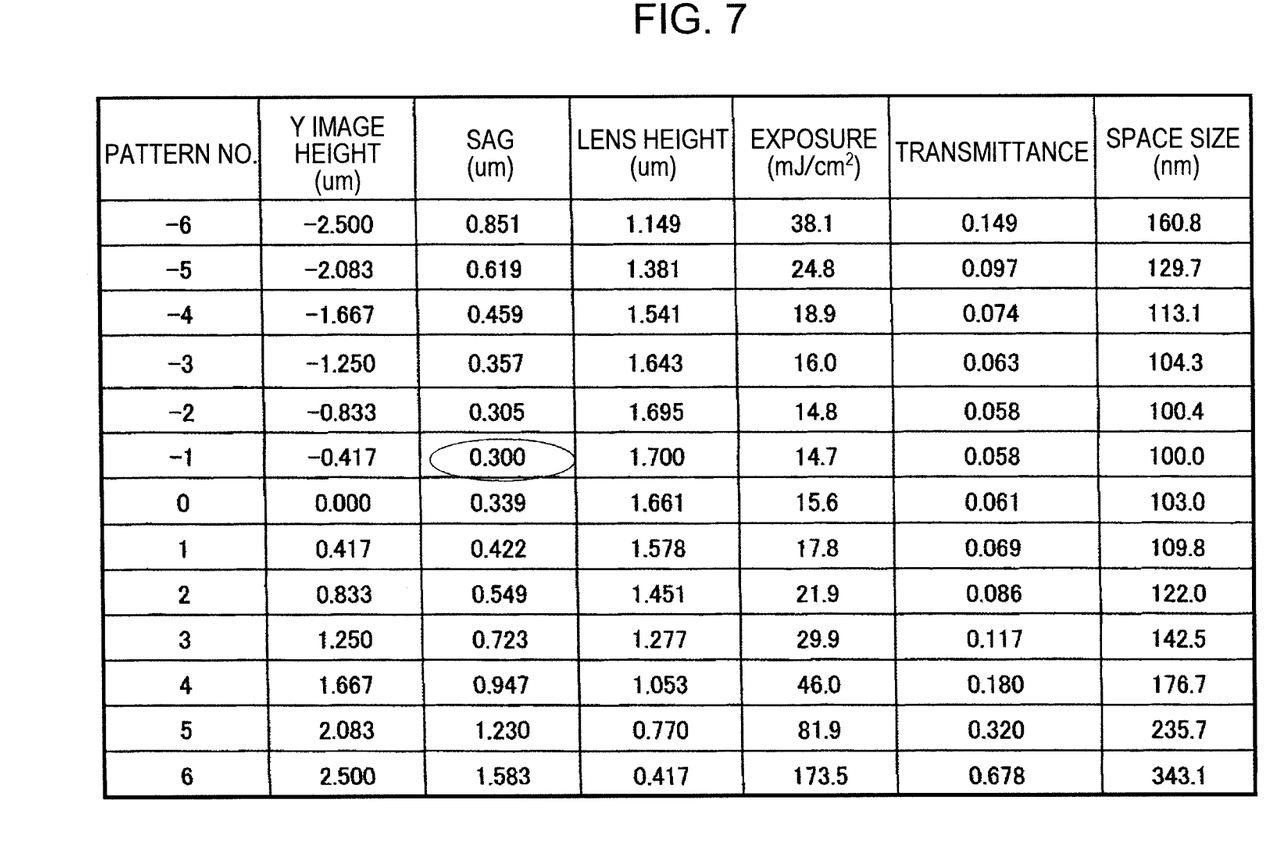
FIG. 7 is a table of the mask design solution according to the embodiment shown in FIGS. 1A and 1B.

FIG. 7 shows the table of the results obtained by Equation (3).

Next, it is assumed that a mask pattern element denoted by A in FIG. 2A (hereafter called portion A) where the amount of sag is at a minimum (that is, the element corresponding to the thinnest transparent section) provides minimum transmittance. The amount of sag at the portion A is denoted as Z0. The space size at this portion is set equal to the lower guaranteed limit in mask manufacturing. In the present embodiment, the minimum space size of the mask is set to 500 nm (100 nm on the wafer), and the pattern element corresponding to the portion A includes a line of 316.7 nm and a space of 100 nm. The transmittance (Tmin) of this pattern element is 5.76%. The amount of sag Z0 at this pattern element (pattern No. −1 in FIG. 7) is set to 300 nm. Accordingly, the amount of exposure (Dset) to be set in the actual exposure step using this mask is calculated as 14.7 mJ/0.0576=256 mJ/cm$^2$.

In addition, the desired transmittance at each y coordinate is expressed as follows:

$$T(y) = T\min \times \frac{\exp\left(\frac{Z(y)-A}{B}\right)}{\exp\left(\frac{Z0-A}{B}\right)} \quad (4)$$

The space size for obtaining this transmittance is calculated using Equation (4) as follows:

$$S(y) = P\sqrt{T(y)} \quad (5)$$

where y is the product mP of the pattern pitch P and an integer m (where m=0, ±1, ±2, . . . , ±5, ±6).

FIG. 7 shows the design solutions of the mask (the space size at each space pattern center coordinate) under the following conditions:

Desired Shape
k=0, n=1.6, $\theta_i$=5°, d=1.7 μm, c=¼ (1 μm)
Characteristic of Residual Thickness of Resist
A=2.72, B=−0.45
Tmin=0.0576
Z0=300 nm Similarly, the patterns for forming on-chip lenses at other image heights are also designed.

The mask pattern is transferred by exposure at the above-described amount of exposure (Dset), so that a desired shape can be obtained after development.

In the above-described explanation, a one-dimensional lens array is described as an example of shading-corrected on-chip lenses. However, the above-described method can also be applied to two-dimensional lens arrays included in solid-state imaging devices like CCD image sensors and CMOS image sensors. In such a case, inclination angles θxi, θyj are calculated for each on-chip lens (i, j) on the basis of the incidence angle characteristics determined by the camera-lens optical system disposed in front of the imaging elements, and then the desired surface function of each on-chip lens is determined. Then, the mask pattern is designed by a method similar to the above-described method for designing the one-dimensional gray scale mask pattern.

Figure 8:
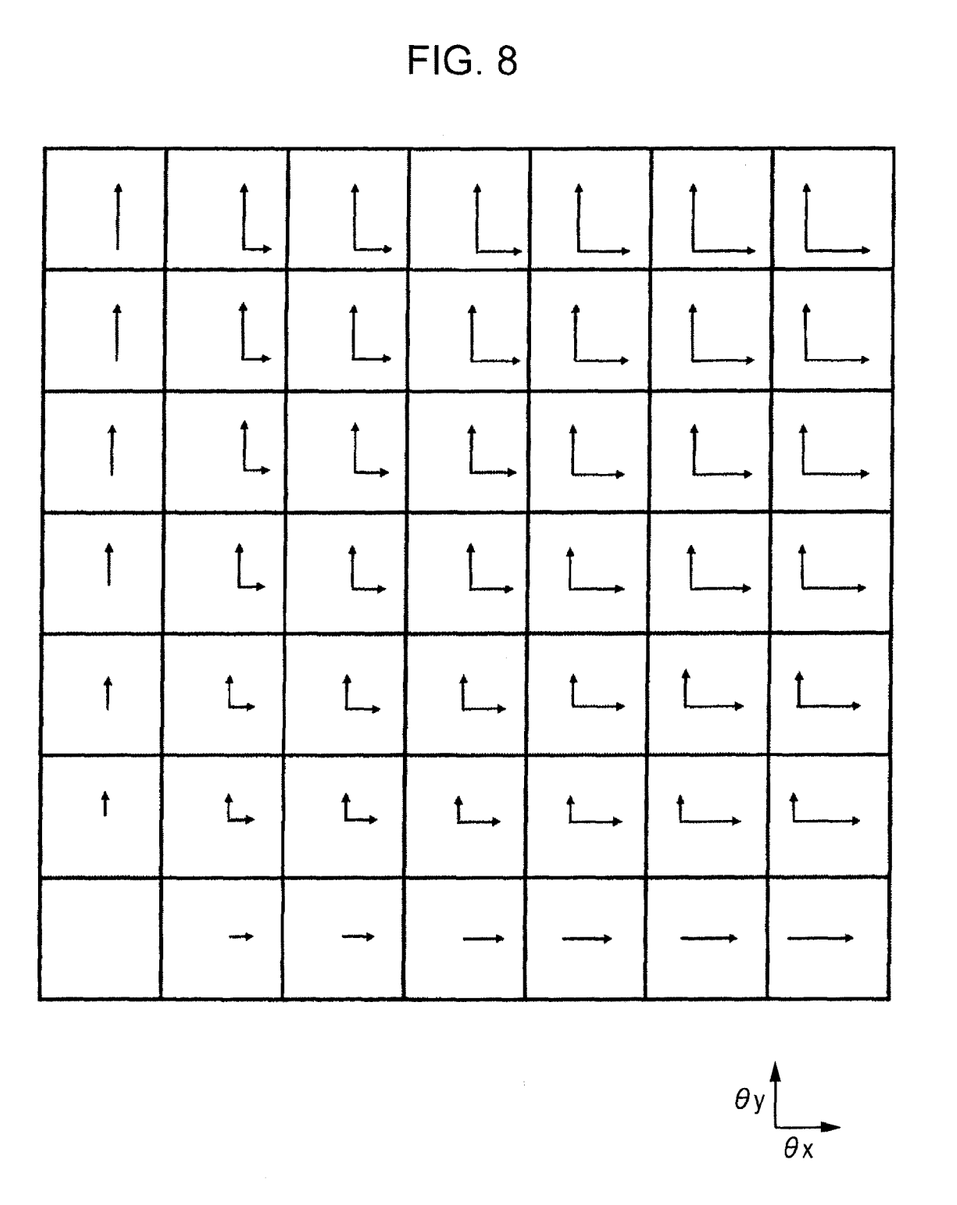
FIG. 8 is a diagram illustrating inclination components superimposed the on-chip lenses when the embodiment of the present invention is applied to a two-dimensional imaging device.

FIG. 8 is a diagram showing inclination components for pixels included in a single quadrant. The arrows shown in each pixel denote inclination angles θx and θy. The two-dimensional pattern may be formed as a contact-hole array or an island array (see, for example, Japanese Patent Application No. 2003-18439).

Figure 6:
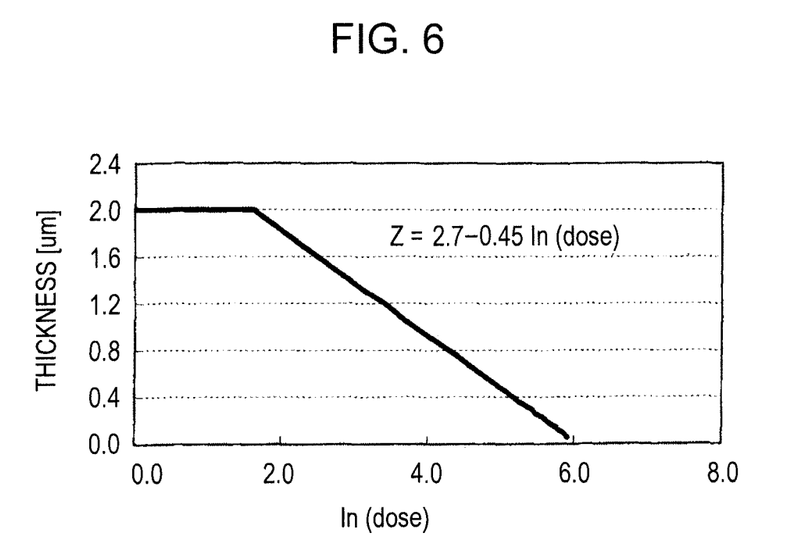
FIG. 6 is a diagram illustrating the exposure characteristic of resist used in the embodiment.

In addition, according to the present embodiment, the mask pattern is designed using the residual thickness characteristic of the resin in open-frame exposure, as shown in FIG. 6. However, the mask pattern may also be designed using the residual thickness characteristic data obtained using a calibration mask formed of a gray-tone pattern (see, for example, Japanese Patent Application No. 2003-281489).

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a plurality of pixels arranged in an array, each of the pixels including a light-receiving section and an on-chip lens, the on-chip lens being formed on an object side of the light-receiving section, wherein for each of the pixels,
the on-chip lens has a lens surface that is defined by a surface function described by a predetermined mathematical function that depends on a distance between the center of the array of pixels and the center of the on-chip lens, and the refractive index of the on-chip lens,
wherein for each on-chip lens, the predetermined mathematical function further depends on an incident angle $\theta_i$ of incident light, and
wherein for each on-chip lens, the predetermined mathematical function further depends at least in part on a term defined by the mathematical function of $$y\tan\left(\frac{\theta_i}{n-1}\right)$$

where y is the distance between the center of the array of pixel and the center of the on-chip lens and n is the refractive index of the on-chip lens.

2. The solid-state imaging device according to claim 1, wherein the lens surface of each of the on-chip lens is formed by subjecting a transparent photosensitive film to exposure using a mask having a gradation pattern such that the lens surface serves to correct shading in accordance with the gradation pattern, and the mask pattern is based upon a residual thickness characteristic data for the photosensitive film.

3. The solid-state imaging device according to claim 1, wherein for each of the pixels, the surface function defines a surface obtained by superimposing an inclination component on a spherical surface.

4. The solid-state imaging device according to claim 1, wherein for each of the pixels, the surface function defines a surface asymmetric about the center of the light receiving section.

5. The solid-state imaging device according to claim 1, wherein for each of the pixels, the surface function defines a surface that causes a principal ray to perpendicularly enter an imaging element at the center of the imaging element.

6. The solid-state imaging device according to claim 1, wherein each of the on-chip lenses of the pixels is formed without performing a thermal reflow process.

7. The solid-state imaging device according to claim 1, wherein for each of the pixels, the lens surface for each on-chip lens is formed by subjecting a transparent photosensitive film to exposure using a mask having a gradation pattern such that the lens surface serves to correct shading in accordance with the gradation pattern.

8. The solid-state imaging device according to claim 7, wherein the transparent photosensitive film is an ultraviolet sensitive resin.

9. The solid-state imaging device according to claim 1, wherein for each on-chip lens of the plurality of pixels, the surface function varies in accordance with an image height.

10. The solid-state imaging device according to claim 9, wherein, for each on-chip lens, the predetermined mathematical function satisfies the relationship:

$$Z(y) = \frac{cy^2}{1 + \sqrt{1 - (1+k)c^2 y^2}} + y\tan\left(\frac{\theta_i}{n-1}\right)$$

where Z is an amount of sag, k is the conic constant, y is the distance between the center of the array of pixels and the center of the on-chip lens, c is the curvature of the on-chip lens, $\theta_i$ is the incident angle, and n is the refractive index of the on-chip lens.

11. The solid-state imaging device according to claim 1, wherein for each on-chip lens, the predetermined mathematical function further depends at least in part on a term defined by the mathematical function of $$\frac{cy^2}{1 + \sqrt{1 - (1+k)c^2 y^2}}$$

where k is the conic constant, y is the distance between the center of the array of pixels and the center of the on-chip lens, and c is the curvature of the on-chip lens.

12. A method for manufacturing a solid-state imaging device, the method comprising:

forming a plurality of light-receiving sections arranged in an array on a substrate;

disposing a transparent photosensitive film over the light-receiving sections on the substrate;

exposing the transparent photosensitive film to light through a mask having a gradation pattern; and developing the transparent photosensitive film after exposure and forming, for each of the light-receiving sections, an on-chip lens, wherein each of the on-chip lenses has a lens surface that that is defined by a surface function described by a predetermined mathematical function that depends on a distance between the center of the array, the center of the on-chip lens, and the refractive index of the on-chip lens wherein for each on-chip lens, the surface function varies in accordance with an image height, wherein for each on-chip lens, the predetermined mathematical function further depends on an incident angle $\theta_i$ of incident light, and wherein for each on-chip lens, the predetermined mathematical function further depends at least in part on a term defined by the mathematical function of $$y\tan\left(\frac{\theta_i}{n-1}\right)$$

where y is the distance between the center of the array of pixels and the center of the on-chip lens and it is the refractive index of the on-chip lens.

13. The method according to claim 12, wherein the mask pattern is based upon a residual thickness characteristic data for the photosensitive film.

14. The method according to claim 12, wherein for each of the on-chip lenses, the surface function defines a surface obtained by superimposing an inclination component on a spherical surface.

15. The method according to claim 12, wherein for each of the on-chip lenses, the surface function defines a surface asymmetric about a center of the corresponding pixel.

16. The method according to claim 12, wherein for each of the on-chip lenses, the surface function defines a surface that causes a principal ray to perpendicularly enter an imaging element at the center of the imaging element.

17. The method according to claim 12, wherein the mask having the gradation pattern comprises a gray-tone mask.

18. The method according to claim 12, wherein the mask having the gradation pattern comprises a gray-tone mask having a binary pattern.

19. The method according to claim 12, wherein full-plate exposure for all of the on-chip lenses is performed in exposing the transparent photosensitive film.

20. The method according to claim 12, wherein each of the on-chip lenses of the pixels is formed without performing a thermal reflow process.

21. The method according to claim 12, wherein the transparent photosensitive film is an ultraviolet sensitive resin.

22. The method according to claim 12, wherein, for each on-chip lens, the predetermined mathematical function satisfies the relationship:

$$Z(y) = \frac{cy^2}{1 + \sqrt{1 - (1+k)c^2 y^2}} + y\tan\left(\frac{\theta_i}{n-1}\right)$$

where Z is an amount of sag, k is the conic constant, y is the distance between the center of the array of pixels and the center of the on-chip lens, c is the curvature of the on-chip lens, $\theta_i$ is the incident angle, and n is the refractive index of the on-chip lens.

23. The method according to claim 12, wherein for each on-chip lens, the predetermined mathematical function further depends at least in part on a term defined by the mathematical function of $$\frac{cy^2}{1 + \sqrt{1 - (1+k)c^2 y^2}}$$

where k is the conic constant, y is the distance between the center of the array of pixels and the center of the on-chip lens, and c is the curvature of the on-chip lens.

* * * * *